US 10,149,406 B2

(12) United States Patent
Shirakami

(10) Patent No.: US 10,149,406 B2
(45) Date of Patent: Dec. 4, 2018

(54) ELECTRONIC APPARATUS

(71) Applicant: FUJITSU LIMITED, Kawasaki-shi, Kanagawa (JP)

(72) Inventor: Takashi Shirakami, Kawasaki (JP)

(73) Assignee: FUJITSU LIMITED, Kawasaki (JP)

(\*) Notice: Subject to any disclaimer, the term of this patent is extended or adjusted under 35 U.S.C. 154(b) by 0 days.

(21) Appl. No.: 15/860,168

(22) Filed: Jan. 2, 2018

(65) Prior Publication Data

US 2018/0206361 A1     Jul. 19, 2018

(30) Foreign Application Priority Data

Jan. 13, 2017    (JP) ................................ 2017-004253

(51) Int. Cl.
     *H05K 7/20*      (2006.01)

(52) U.S. Cl.
     CPC ..... *H05K 7/20145* (2013.01); *H05K 7/20727* (2013.01); *H05K 7/20836* (2013.01)

(58) Field of Classification Search
     CPC .......... H05K 7/20145; H05K 7/20727; H05K 7/20836
     USPC ............................................ 361/679.46, 696
     See application file for complete search history.

(56) References Cited

U.S. PATENT DOCUMENTS

| | | | |
|---|---|---|---|
| 9,098,234 B2 * | 8/2015 | Fujiwara | G06F 1/1601 |
| 9,795,055 B1 * | 10/2017 | Campbell | H05K 7/20145 |
| 2010/0124012 A1 | 5/2010 | Kondo et al. | |

FOREIGN PATENT DOCUMENTS

| | | |
|---|---|---|
| JP | 2004-295702 | 10/2004 |
| JP | 2010-122887 | 6/2010 |

\* cited by examiner

*Primary Examiner* — Mukund G Patel
(74) *Attorney, Agent, or Firm* — Fujitsu Patent Center

(57) ABSTRACT

An electronic apparatus includes a casing provided with a ventilating opening disposed in a front surface of the casing; a plurality of fan devices disposed in a rear portion of the casing; a board that includes a heat generating device disposed on an upper surface of the board and includes a heat radiating device disposed on a lower surface of the board, and is housed in the casing, and is configured to divide the flow of the air into two in an upward-downward direction of the casing; a heat transport member configured to couple the heat generating device to the heat radiating device; and a seal member configured to form a duct structure extending in the front-rear direction of the casing between the board and a bottom wall portion of the casing by sealing a gap penetrating in a thickness direction of the board between the board and the casing.

7 Claims, 17 Drawing Sheets

FIG. 16

|  | DEVICE A | DEVICE B | DEVICE C | DEVICE n |
|---|---|---|---|---|
| SPECIFIED TEMPERATURE | Tmax_A | Tmax_B | Tmax_C | Tmax_n |
| SPECIFIED UPPER LIMIT VALUE | Tup_A | Tup_B | Tup_C | Tup_n |
| SPECIFIED LOWER LIMIT VALUE | Tdown_A | Tdown_B | Tdown_C | Tdown_n |
| IS MOUNTING SURFACE LOWER SURFACE OF BOARD? | YES | YES | YES | YES OR NO |

…

ELECTRONIC APPARATUS

CROSS-REFERENCE TO RELATED APPLICATION

This application is based upon and claims the benefit of priority of the prior Japanese Patent Application No. 2017-004253, filed on Jan. 13, 2017, the entire contents of which are incorporated herein by reference.

FIELD

The embodiments discussed herein are related to an electronic apparatus that forcibly air-cools the inside of a casing by a fan unit.

BACKGROUND

The following is illustrated as an electronic apparatus that forcibly air-cools the inside of a casing by a fan unit (see Japanese Laid-open Patent Publication No. 2004-295702, for example). For example, in the illustrated electronic apparatus, the casing houses a board, and the board divides the flow of air inside the casing into two in the upward-downward direction of the casing. A central processing unit (CPU) and a heat radiating device formed by multiple stages of cooling fins are arranged on an upper surface of the board. The CPU and the heat radiating device are coupled to each other by heat pipes. The CPU is cooled by transporting the heat of the CPU to the heat radiating device by the heat pipes, and cooling the heat radiating device by a flow of air. Japanese Laid-open Patent Publication No. 2010-122887, for example, is disclosed as another related art.

However, in a case where in addition to a heat generating device such as the CPU, devices such as other electronic parts are arranged on the upper surface of the board on which upper surface the heat radiating device is mounted, there is a fear that the other devices may not be able to be cooled because the flow of the air is obstructed by the heat radiating device. It is desirable to be able to cool both the heat generating device and the other devices arranged on the board effectively.

SUMMARY

According to an aspect of the embodiments, an electronic apparatus includes a casing provided with a ventilating opening disposed in a front surface of the casing; a plurality of fan devices that are disposed in a rear portion of the casing, and are configured to form a flow of air in a front-rear direction of the casing inside the casing; a board that includes a heat generating device disposed on an upper surface of the board and includes a heat radiating device disposed on a lower surface of the board, and is housed in the casing, and is configured to divide the flow of the air into two in an upward-downward direction of the casing; a heat transport member configured to couple the heat generating device to the heat radiating device; and a seal member configured to form a duct structure extending in the front-rear direction of the casing between the board and a bottom wall portion of the casing by sealing a gap penetrating in a thickness direction of the board between the board and the casing.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 16 is a diagram illustrating device information stored in a storage unit in an electronic apparatus according to the second embodiment.

DESCRIPTION OF EMBODIMENTS

First Embodiment

Description will first be made of a first embodiment of a technology disclosed in the present application.

Figure 1:
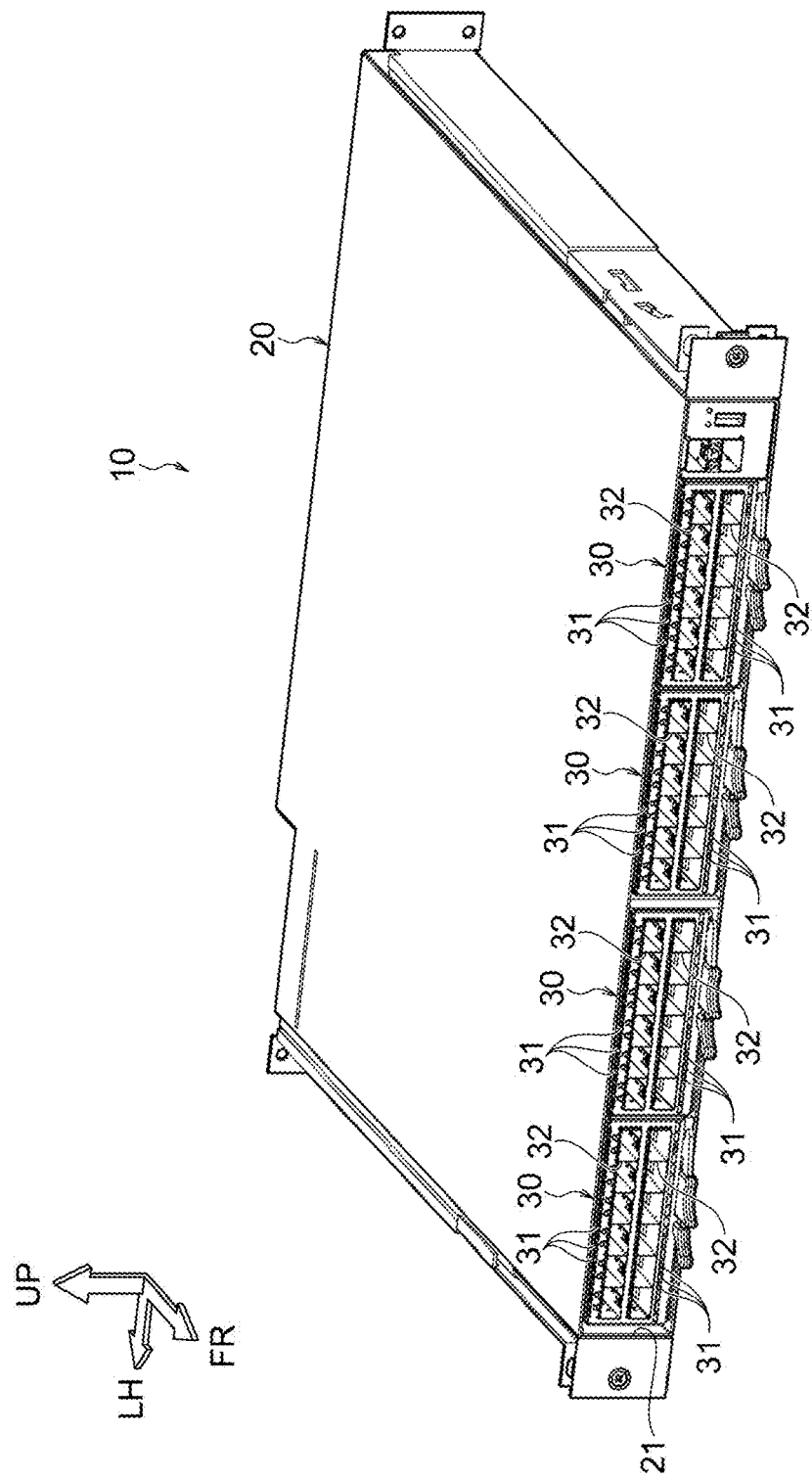
FIG. 1 is a perspective view of an electronic apparatus according to a first embodiment as viewed from the front.
Figure 2:
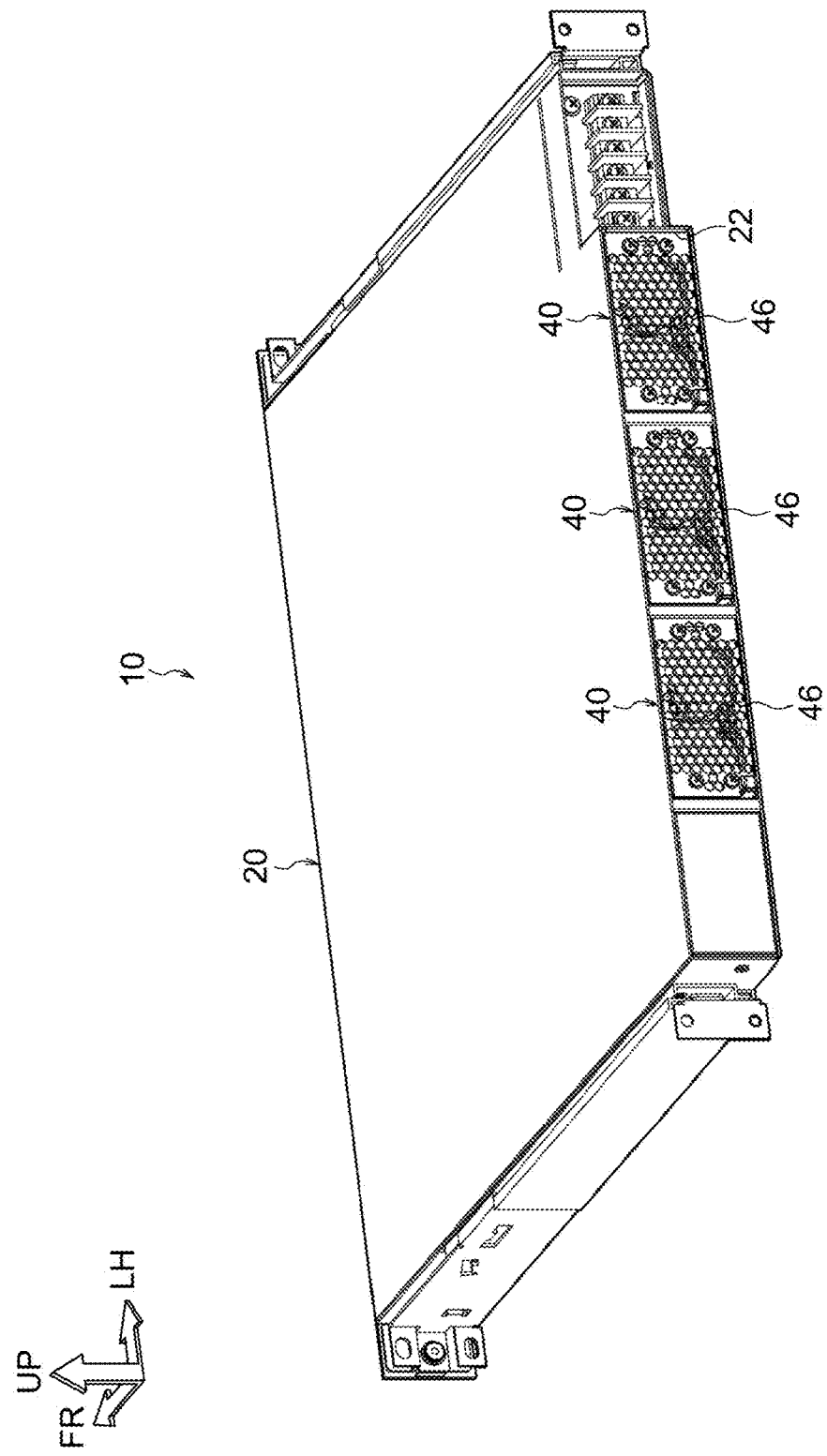
FIG. 2 is a perspective view of an electronic apparatus according to the first embodiment as viewed from the rear.

FIG. 1 is a perspective view of an electronic apparatus according to a first embodiment as viewed from the front. FIG. 2 is a perspective view of an electronic apparatus according to the first embodiment as viewed from the rear. In respective figures including FIG. 1 and FIG. 2, an arrow FR, an arrow LH, and an arrow UP respectively indicate a front side in a front-rear direction, one side (left side) in a width direction, and an upper side in an upward-downward direction in the electronic apparatus 10.

As illustrated in FIG. 1 and FIG. 2, an electronic apparatus 10 according to the first embodiment includes a casing 20 of a flat box type. The front-rear direction, width direction, and upward-downward direction of the casing 20 to be described in the following are the same as the front-rear direction, width direction, and upward-downward direction of the electronic apparatus 10. An opening 21 is formed in a front surface of the casing 20. A plurality of upper and lower intake ports 31 arranged in detachable units 30 to be described later are arranged inside the opening 21. On the other hand, an opening 22 is formed in a back surface of the casing 20. Exhaust ports 46 provided to fan units 40 to be described later are arranged inside the opening 22. The intake ports 31 are an example of a "ventilating opening disposed in a front surface of the casing."

Figure 3:
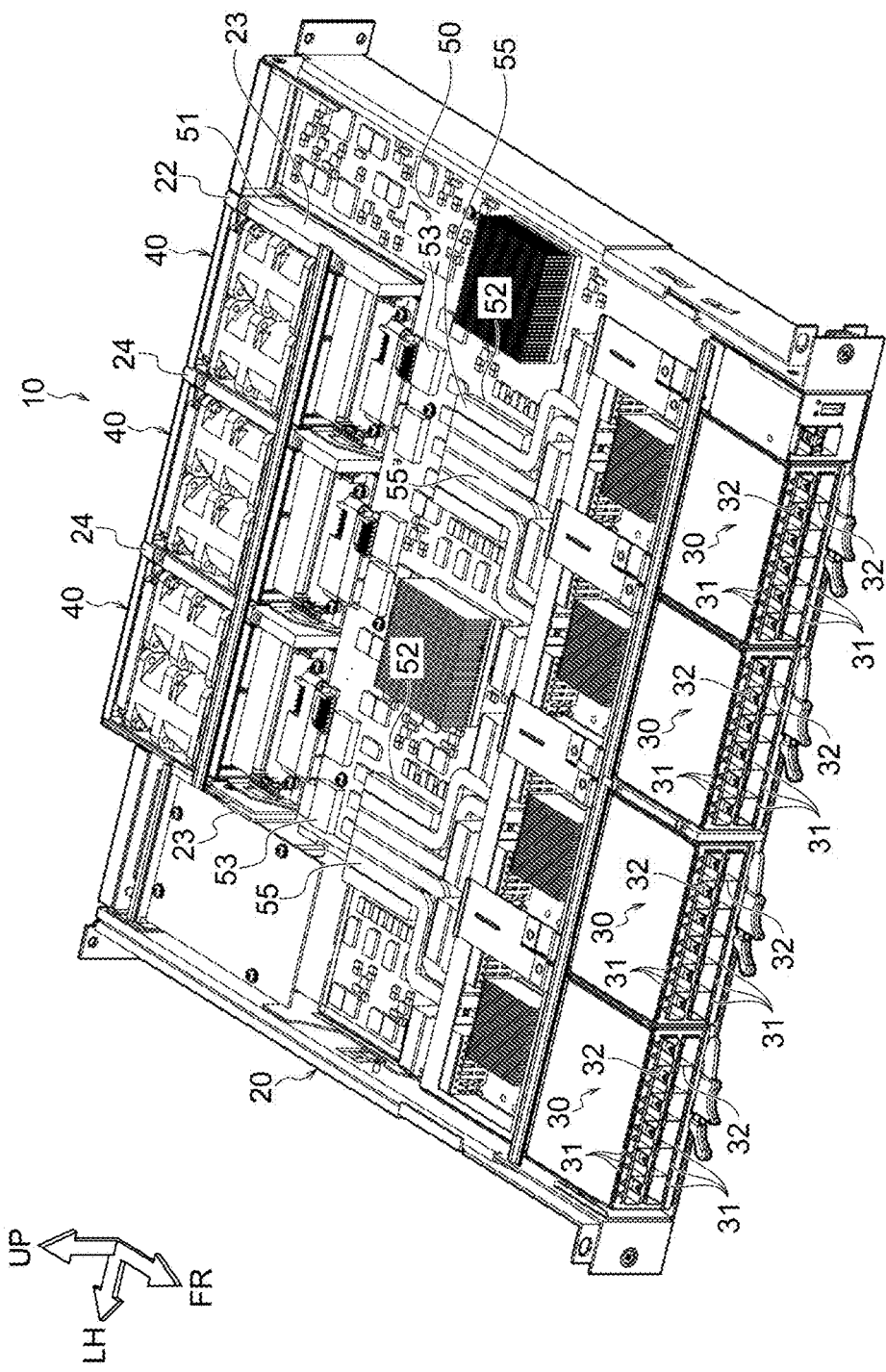
FIG. 3 is a perspective view illustrating a state in which a top wall portion is removed from a casing of an electronic apparatus according to the first embodiment.

FIG. 3 is a perspective view illustrating a state in which a top wall portion is removed from a casing of an electronic apparatus according to the first embodiment. The casing and the electronic apparatus depicted in FIG. 3 may be the casing 20 and the electronic apparatus 10 depicted in FIG. 1. As illustrated in FIG. 3, the electronic apparatus 10 includes a plurality of detachable units 30, a plurality of fan units 40, and a board 50.

The plurality of detachable units 30 are devices arranged in a front portion of the casing 20. The plurality of fan units 40 are devices arranged in a rear portion of the casing 20. The plurality of detachable units 30 are arranged side by side in the width direction of the casing 20. The plurality of fan units 40 are also arranged side by side in the width direction of the casing 20. The board 50 is disposed with the upward-downward direction of the casing 20 as the thickness direction of the board 50, and is housed in the casing 20. The board 50 is, for example, a motherboard.

The plurality of detachable units 30 are each provided with the plurality of intake ports 31 described above. The plurality of intake ports 31 are each provided to an upper portion and a lower portion of each detachable unit 30. The plurality of detachable units 30 are detachable from the board 50 in the front-rear direction of the casing 20 through the opening 21 in the front surface of the casing 20. The detachable units 30 are provided with mounting portions 32 in which a detachable small light module is mounted.

A rectangular notch portion 51 notched from the back side of the casing 20 is formed in the board 50. The plurality of fan units 40 are housed in the notch portion 51. The plurality of fan units 40 may be inserted into and removed from the notch portion 51 in the front-rear direction of the casing 20 through the opening 22 in the back surface of the casing 20. The plurality of fan units 40, for example, operate to suck air within the casing 20 and exhaust the air to the rear of the casing 20.

Each of guide walls 23 for guiding the air is provided to both sides in the width direction of the notch portion 51. Partition walls 24 are each provided between the plurality of fan units 40. The guide walls 23 and the partition walls 24 are provided to the casing 20. The guide walls 23 and the partition walls 24 each extend in the front-rear direction of the casing 20, and are arranged with the upward-downward direction of the casing 20 as the height direction of the guide walls 23 and the partition walls 24.

A plurality of heat generating devices 52, other devices 53, and the like are arranged on an upper surface of the board 50. The plurality of heat generating devices 52 include, for example, a high power device such as a central processing unit (CPU). The other devices 53 are, for example, electronic parts.

Figure 4:
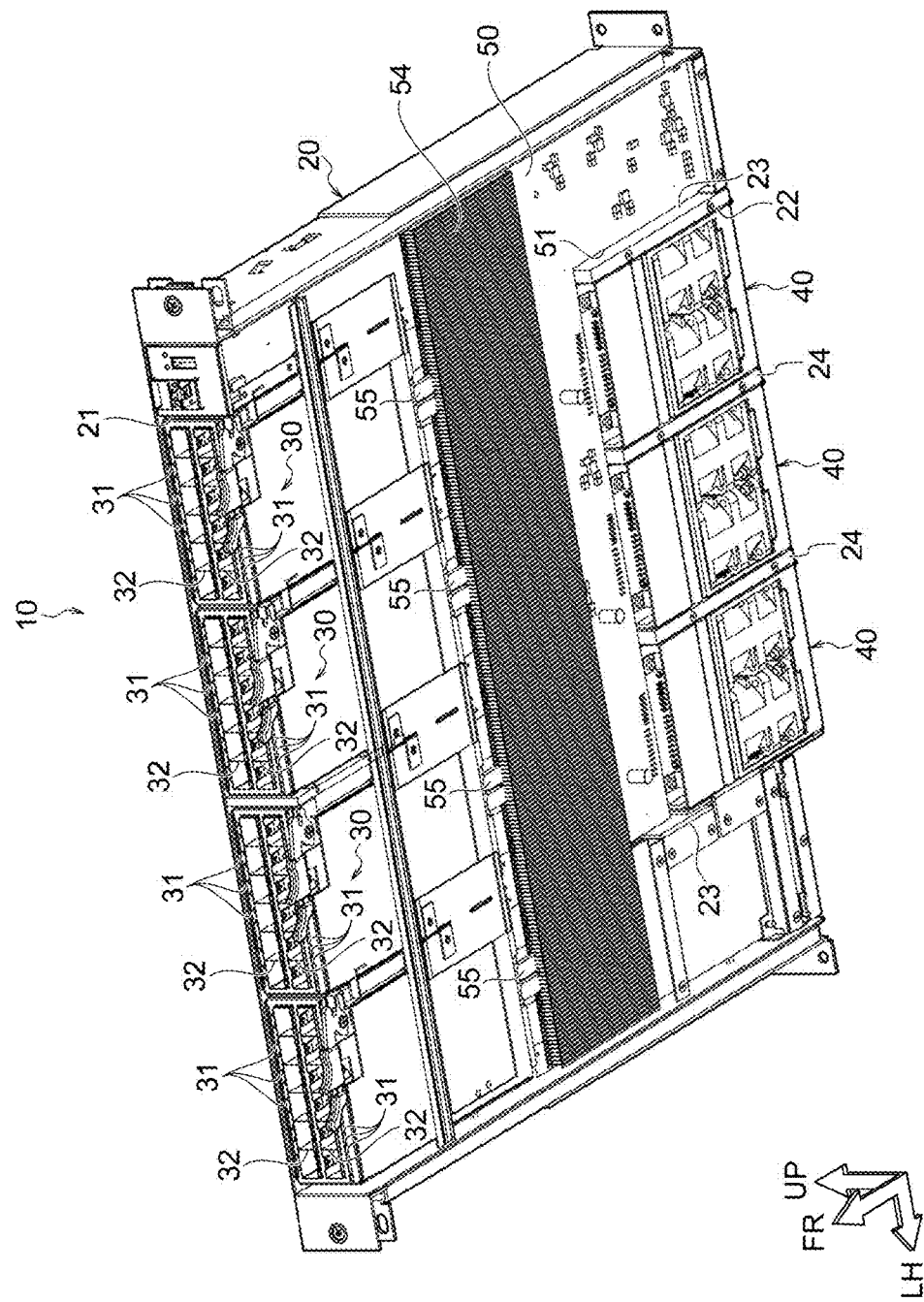
FIG. 4 is a perspective view illustrating a state in which a bottom wall portion is removed from a casing of an electronic apparatus according to the first embodiment.

FIG. 4 is a perspective view illustrating a state in which a bottom wall portion is removed from a casing of an electronic apparatus according to the first embodiment. The casing and the electronic apparatus depicted in FIG. 4 may be the casing 20 and the electronic apparatus 10 depicted in FIG. 1. As illustrated in FIG. 4, a heat radiating device 54 is disposed on a lower surface of the board 50. The heat radiating device 54 is, for example, configured such that a plurality of fins whose thickness direction is the width direction of the casing 20 are arranged in the width direction of the casing 20. The width direction of the board 50 is the same as the width direction of the casing 20. The heat radiating device 54 extends from one end side to another end side of the board 50 in the width direction of the board 50. In addition to the heat radiating device 54, small parts generating a small amount of heat such as capacitors and resistances are arranged on the lower surface of the board 50.

As illustrated in FIG. 3 and FIG. 4, a plurality of heat transport members 55 are provided to the board 50. The heat transport members 55 are, for example, heat pipes, flexible heat pipes, liquid transport tubes, or the like. The heat transport members 55 extend from the upper surface side of the board 50 to the lower surface side of the board 50, and couples the heat generating devices 52 to the heat radiating device 54.

Figure 5:
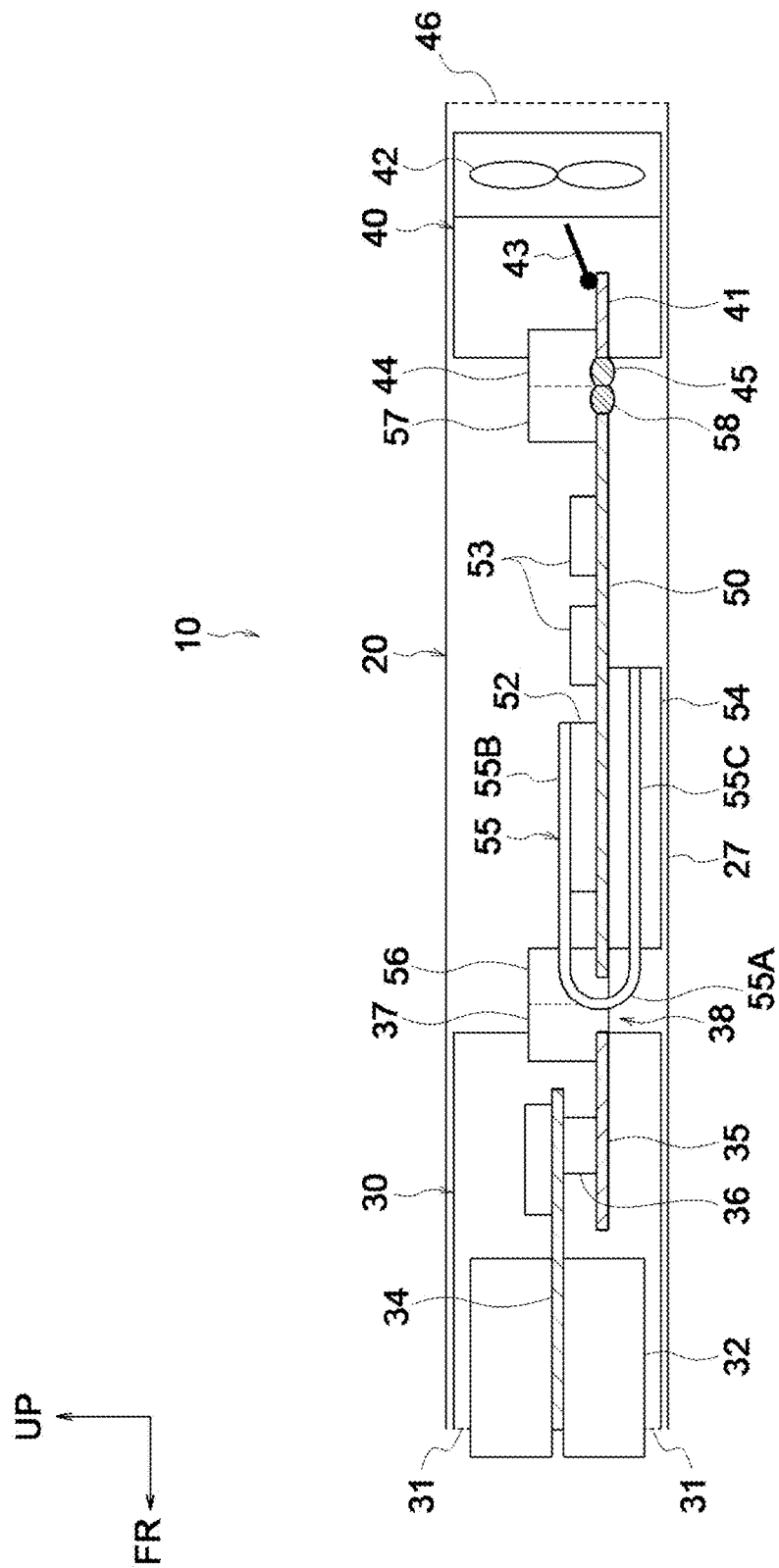
FIG. 5 is a side sectional view of an electronic apparatus according to the first embodiment.

FIG. 5 is a side sectional view of an electronic apparatus according to the first embodiment. The electronic apparatus depicted in FIG. 5 may be the electronic apparatus 10 depicted in FIG. 1. As illustrated in FIG. 5, each of the detachable units 30, for example, includes a base board 34 and a coupling board 35. The base board 34 and the coupling board 35 are arranged with the upward-downward direction of the casing 20 as the thickness direction of the base board 34 and the coupling board 35. The base board 34 and the coupling board 35 are electrically coupled to each other via a coupling member 36 or the like.

The coupling board 35 is disposed nearer to the front surface side of the casing 20 than the board 50, and is juxtaposed to the board 50 in the front-rear direction of the casing 20. A connector 37 is disposed on the board 50 side of the coupling board 35. A connector 56 is disposed on the coupling board 35 side of the board 50. The connector 37 of the detachable unit 30 is coupled to the connector 56 of the board 50. The detachable unit 30 is attached to and detached from the board 50 by inserting and removing the connector 37 into and from the connector 56.

A gap 38 is formed between the coupling board 35 and the board 50. The above-described heat transport member 55 extends from the upper surface side to the lower surface side of the board 50 through the gap 38. The heat transport member 55 is bent in a U-shape as viewed from the side. A curved portion 55A of the heat transport member 55 is inserted in the gap 38. One end 55B and another end 55C of the heat transport member 55 are respectively arranged on the upper side and the lower side of the board 50, and extend from the curved portion 55A toward the back side of the casing 20. The one end 55B of the heat transport member 55 is coupled to a heat generating device 52. The other end 55C of the heat transport member 55 is coupled to the heat radiating device 54.

Each of the above-described fan units 40, for example, includes a coupling board 41, a fan 42, and a fin 43. The coupling board 41 is disposed with the upward-downward direction of the casing 20 as the thickness direction of the coupling board 41. The coupling board 41 is disposed nearer to the back side of the casing 20 than the board 50, and is juxtaposed to the board 50 in the front-rear direction of the casing 20.

A connector 44 is disposed on the board 50 side of the coupling board 41. A connector 57 is disposed on the coupling board 41 side of the board 50. The connector 44 of the fan unit 40 is coupled to the connector 57 of the board 50. The fan unit 40 is attached to and detached from the board 50 by inserting and removing the connector 44 into and from the connector 57.

The coupling board 41 and the board 50 are spaced apart from each other in the front-rear direction of the casing 20. A gasket 45 is disposed on the board 50 side of the coupling board 41. A gasket 58 is disposed on the coupling board 41 side of the board 50. In a state in which the connector 44 and the connector 57 are coupled to each other and thus the fan unit 40 is coupled to the board 50, the gasket 45 and the gasket 58 abut against each other, and thereby seal a gap between the coupling board 41 and the board 50.

The fan 42 is disposed in a rear portion of the fan unit 40, and is positioned nearer to the back side of the casing 20 than the coupling board 41. An exhaust port 46 provided for the fan unit 40 is located in the rear of the fan 42. The fin 43 is disposed on a rear end portion of an upper surface of the coupling board 41, and is opposed to the fan 42 in the front-rear direction of the casing 20. The fin 43 is rotated in the upward-downward direction of the casing 20 manually or electrically.

Figure 6:
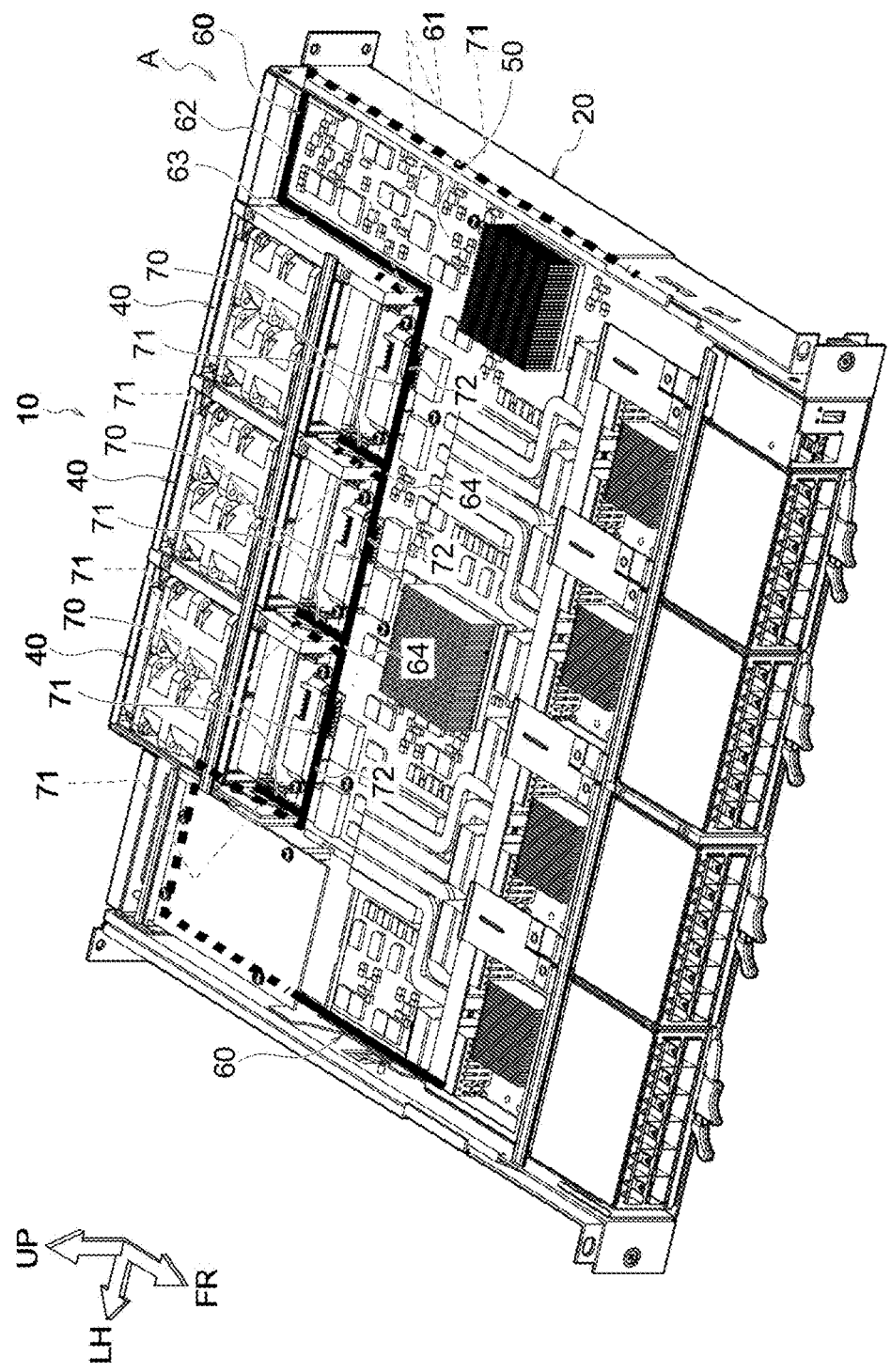
FIG. 6 is a perspective view illustrating, in an emphasized manner, seal parts provided to an inside of a casing in an electronic apparatus according to the first embodiment, the perspective view corresponding to FIG. 3.
Figure 7:
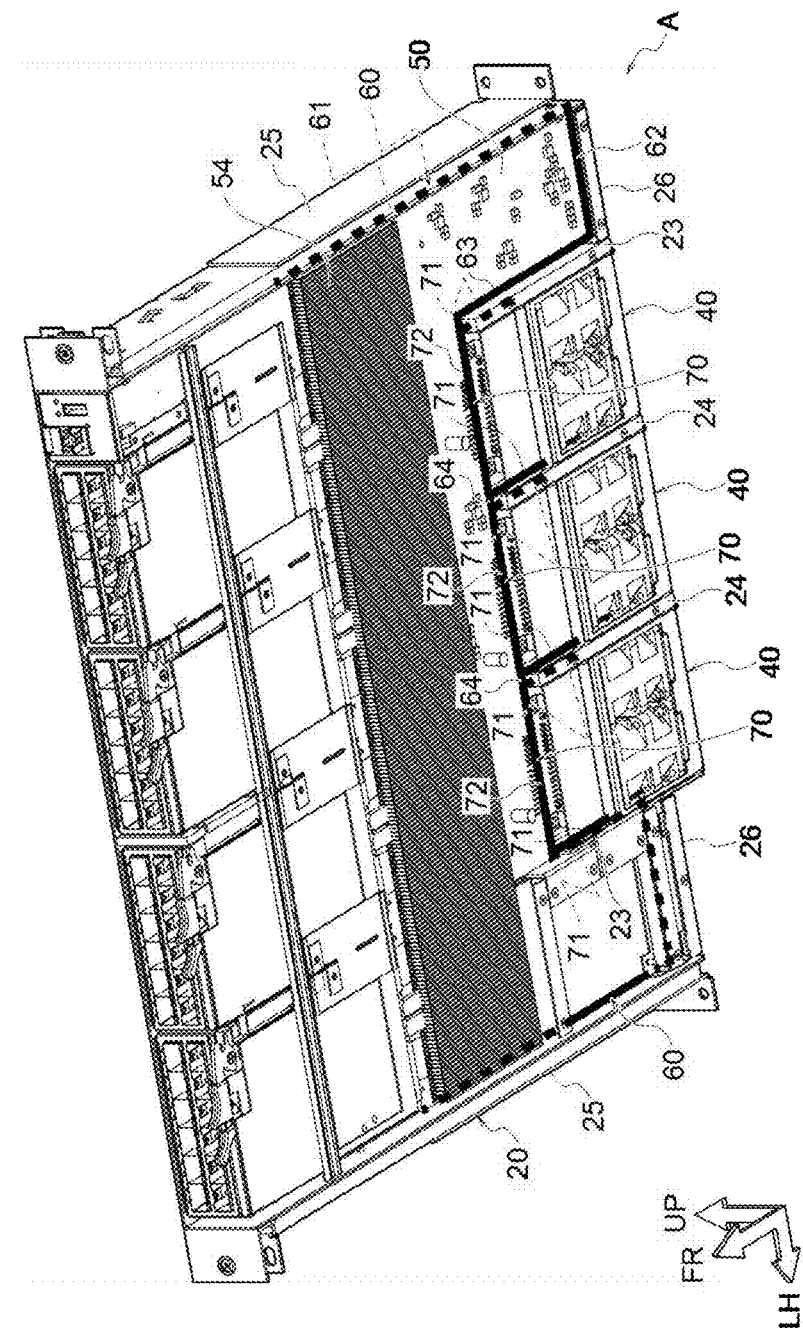
FIG. 7 is a perspective view illustrating, in an emphasized manner, seal parts provided to an inside of a casing in an electronic apparatus according to the first embodiment, the perspective view corresponding to FIG. 4.

FIG. 6 and FIG. 7 are diagrams illustrating, in an emphasized manner, seal parts provided to an inside of a casing in an electronic apparatus according to the first embodiment. The casing and the electronic apparatus depicted in FIGS. 6 and 7 may be the casing 20 and the electronic apparatus 10 depicted in FIG. 1. The seal parts illustrated in an emphasized manner in FIG. 6 and FIG. 7 are formed by a first seal member 60 and a second seal member 70. In FIG. 6 and FIG. 7, the first seal member 60 is illustrated in a state of being colored in dark gray. The second seal member 70 is illustrated in a state of being colored in light gray. Members having a seal property, such, for example, as gaskets, tapes, or sealants, are applied as the first seal member 60 and the second seal member 70.

The first seal member 60 is for sealing gaps penetrating in the thickness direction of the board 50 between the board 50 and the casing 20. The first seal member 60, for example, includes a side edge seal portion 61, a rear end seal portion 62, a guide wall seal portion 63, and a partition wall seal portion 64.

The second seal member 70 is for sealing gaps penetrating in the thickness direction of the board 50 between the fan units 40 and the casing 20 and between the fan units 40 and the board 50. The second seal member 70 includes a first fan unit seal portion 71 and a second fan unit seal portion 72.

Figure 8:
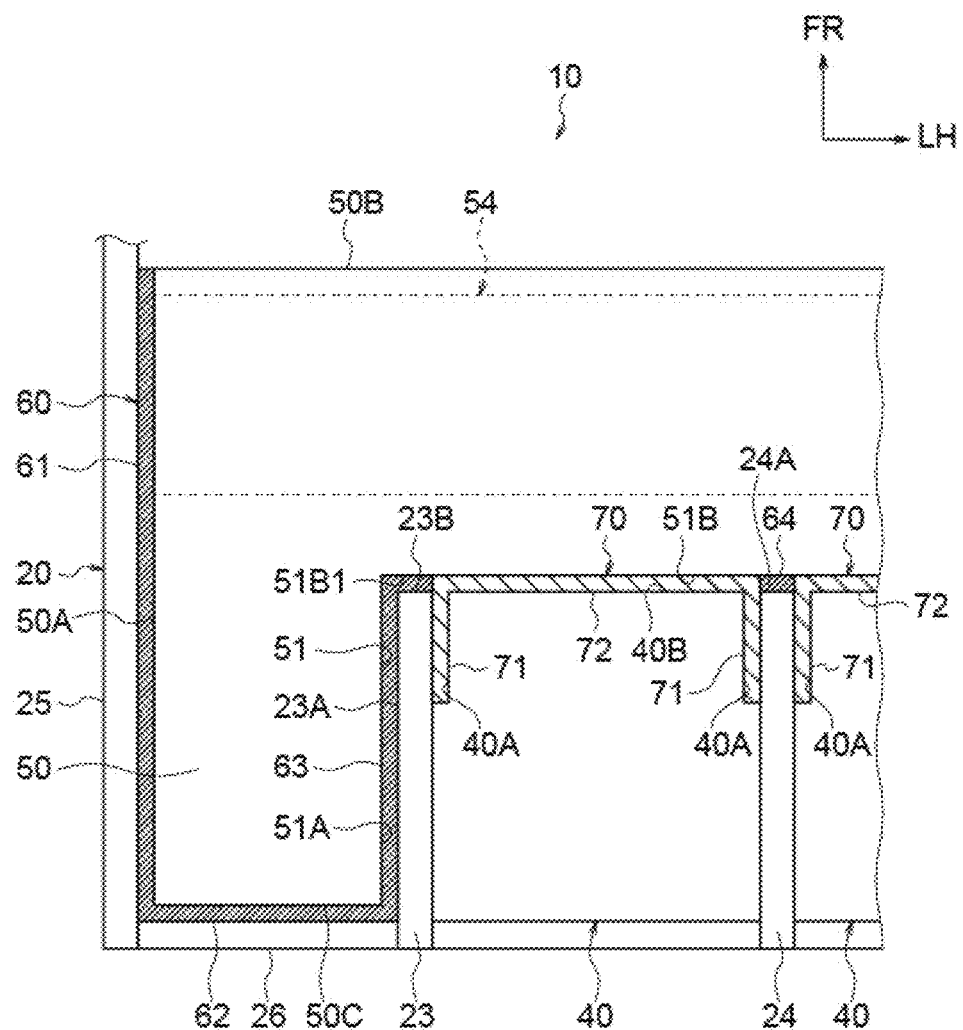
FIG. 8 is an enlarged plan view illustrating an A portion in FIG. 6 in a simplified manner.
Figure 9:
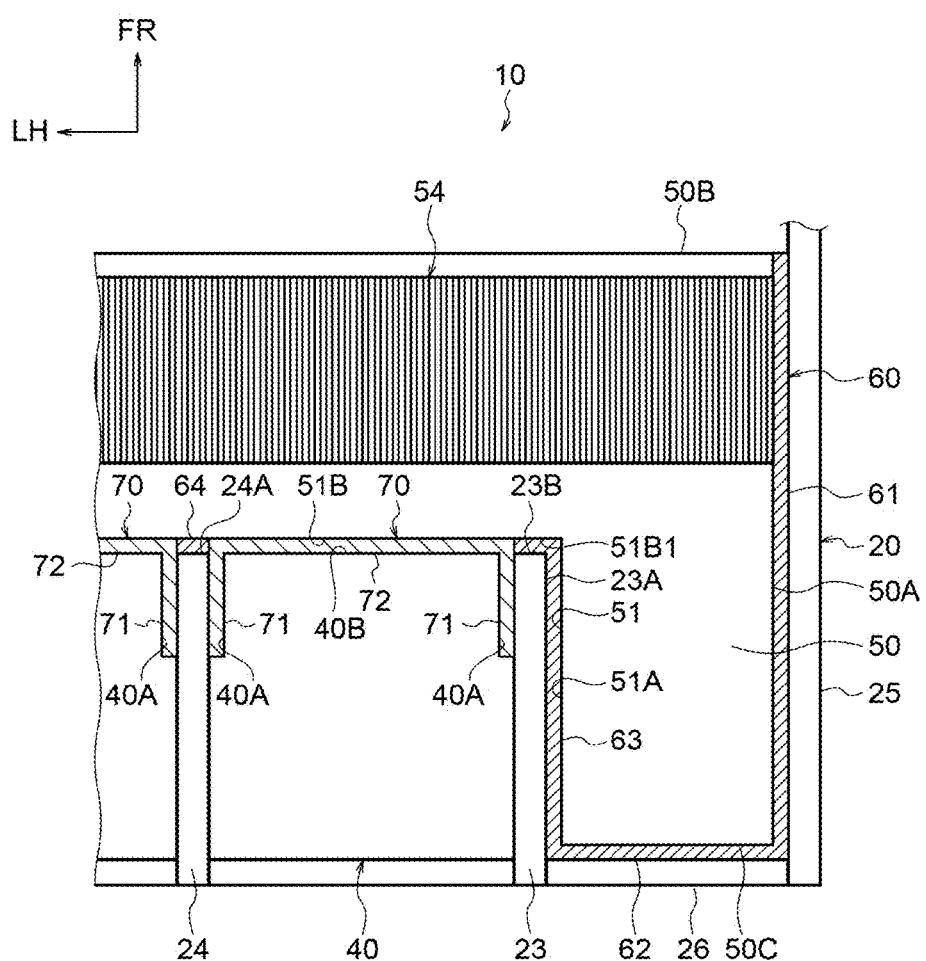
FIG. 9 is an enlarged bottom view illustrating an A portion in FIG. 7 in a simplified manner.

FIG. 8 is an enlarged plan view illustrating an A portion in FIG. 6 in a simplified manner. FIG. 9 is an enlarged bottom view illustrating an A portion in FIG. 7 in a simplified manner. As illustrated in FIG. 8 and FIG. 9, a side edge portion 50A of the board 50 is opposed to a side wall portion 25 of the casing 20. The side edge seal portion 61 of the first seal member 60 is disposed from a front end portion 50B to a rear end portion 50C of the board 50 along the side edge portion 50A of the board 50. The side edge seal portion 61 seals a gap between the side edge portion 50A of the board 50 and the side wall portion 25 of the casing 20.

A rear wall portion 26 of the casing 20 is located on both sides in the width direction of the plurality of fan units 40. The rear end portion 50C of the board 50 is opposed to the rear wall portion 26 of the casing 20. The rear end seal portion 62 seals a gap between the rear end portion 50C of the board 50 and the rear wall portion 26 of the casing 20.

An outside surface 23A of the guide wall 23 provided to the casing 20 is opposed to a longitudinal edge portion 51A of the notch portion 51 formed in the board 50. A front end portion 23B of the guide wall 23 is opposed to an end portion 51B1 of a lateral edge portion 51B of the notch portion 51. The guide wall seal portion 63 seals respective gaps penetrating in the thickness direction of the board 50 between the outside surface 23A of the guide wall 23 and the longitudinal edge portion 51A of the notch portion 51 and between the front end portion 23B of the guide wall 23 and the end portion 51B1 of the lateral edge portion 51B of the notch portion 51.

A front end portion 24A of the partition wall 24 is opposed to the lateral edge portion 51B of the notch portion 51 formed in the board 50. The partition wall seal portion 64 seals a gap penetrating in the thickness direction of the board 50 between the front end portion 24A of the partition wall 24 and the lateral edge portion 51B of the notch portion 51.

Side surface portions 40A on both sides of the fan unit 40 are each opposed to the guide wall 23 or the partition wall 24. The first fan unit seal portion 71 of the second seal member 70 seals gaps penetrating in the thickness direction of the board 50 between the side surface portions 40A of the fan unit 40 and the guide wall 23 and the partition wall 24. A front end portion 40B of the fan unit 40 is opposed to the lateral edge portion 51B of the notch portion 51 formed in the board 50. The second fan unit seal portion 72 seals a gap penetrating in the thickness direction of the board 50 between the front end portion 40B of the fan unit 40 and the lateral edge portion 51B of the notch portion 51.

Figure 10:
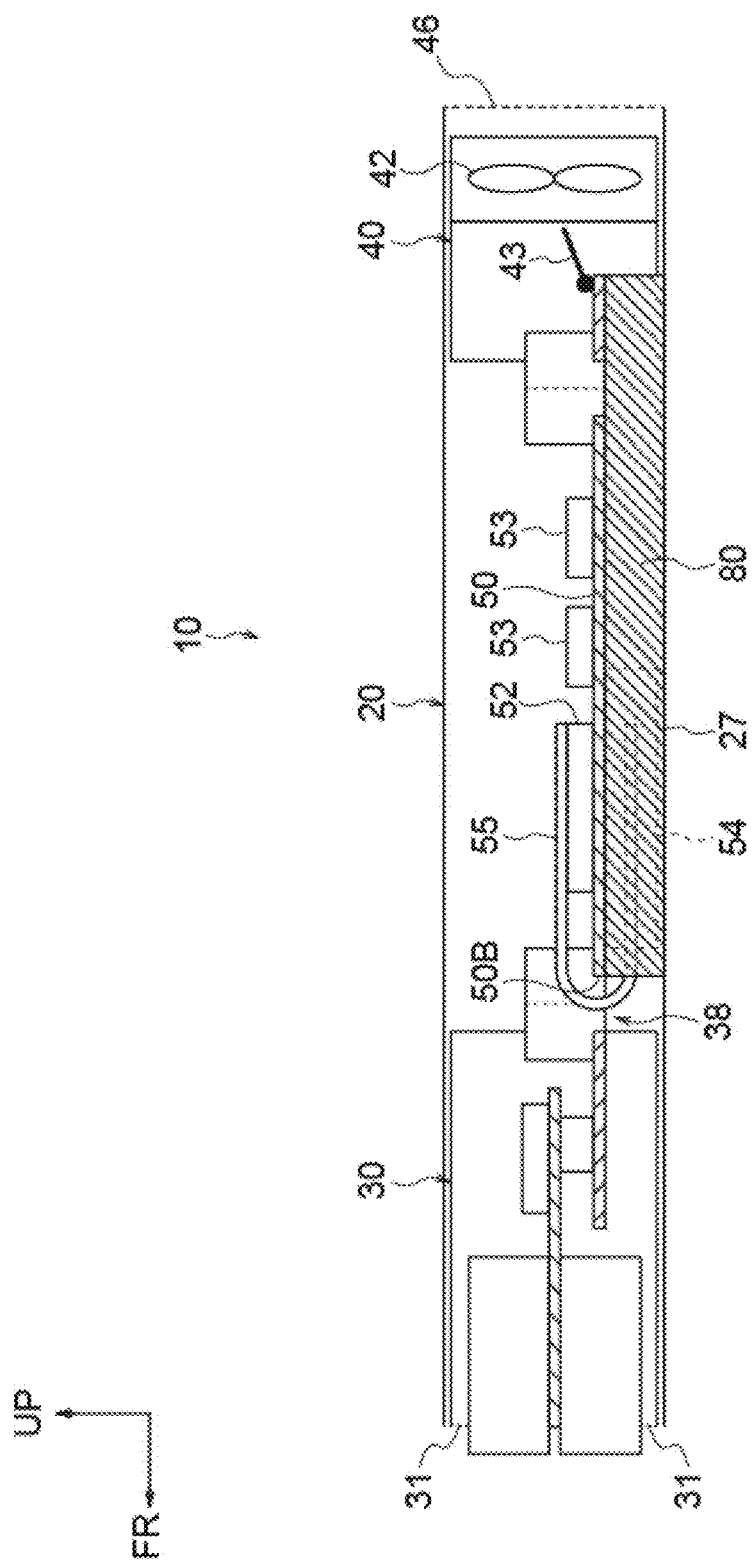
FIG. 10 is a side sectional view illustrating, in an emphasized manner, a duct structure formed inside a casing in an electronic apparatus according to the first embodiment.

FIG. 10 is a side sectional view illustrating, in an emphasized manner, a duct structure formed inside a casing in an electronic apparatus according to the first embodiment. The casing and the electronic apparatus depicted in FIG. 10 may be the casing 20 and the electronic apparatus 10 depicted in FIG. 1. Because the first seal member 60 (see FIG. 8 and FIG. 9) seals gaps penetrating in the thickness direction of the board 50 between the board 50 and the casing 20 as described above, a duct structure 80 extending in the front-rear direction of the casing 20 is formed between the board 50 and a bottom wall portion 27 of the casing 20.

The duct structure 80 is, for example, formed by a part enclosed by the board 50, a pair of side wall portions 25 of the casing 20, the bottom wall portion 27 of the casing 20, and the first seal member 60. Because the first seal member 60 includes the side edge seal portion 61, the rear end seal portion 62, the guide wall seal portion 63, and the partition wall seal portion 64 as described above, the duct structure 80 extends from the front end portion 50B of the board 50 to the fan units 40.

Because the second seal member 70 (see FIG. 8 and FIG. 9) seals gaps penetrating in the thickness direction of the board 50 between the fan units 40 and the casing 20 and between the fan units 40 and the board 50 as described above, airtightness on the fan unit 40 side in the duct structure 80 is enhanced.

Figure 11:
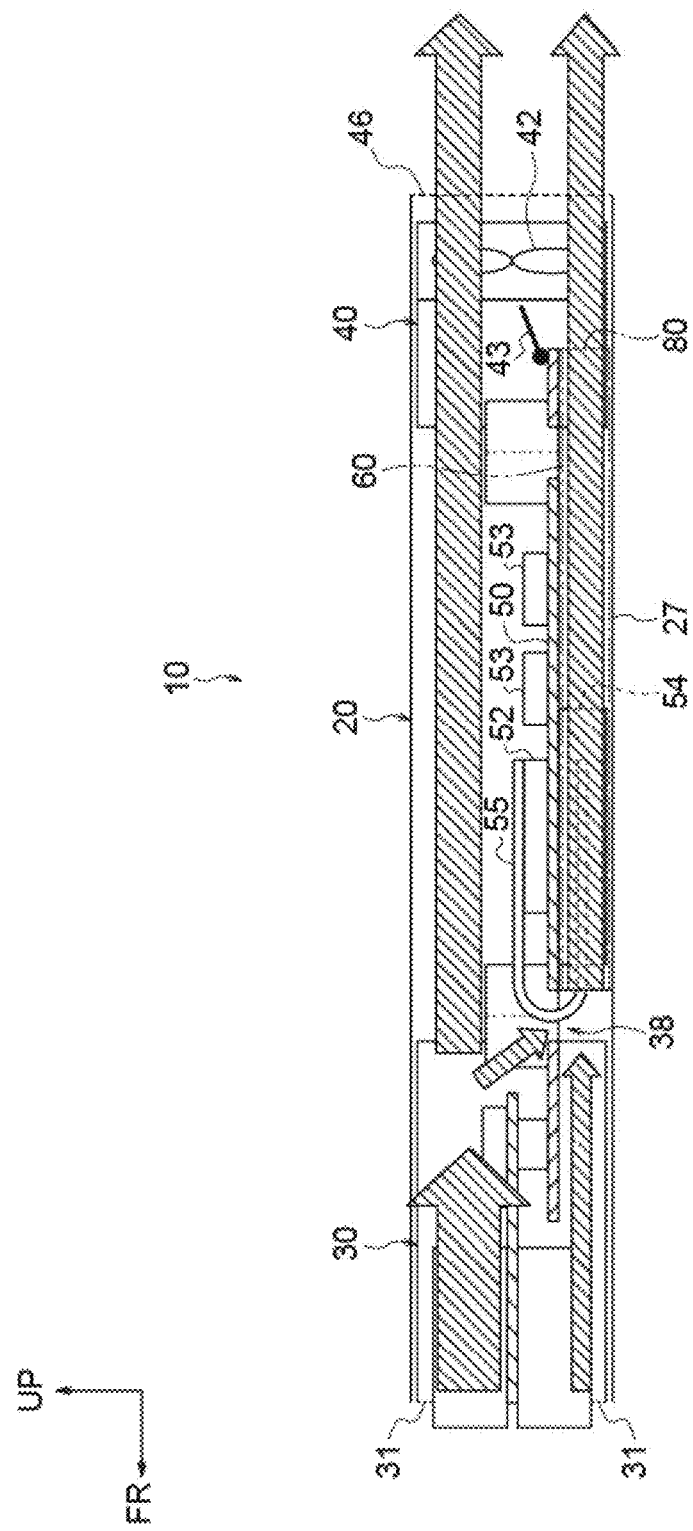
FIG. 11 is a side sectional view illustrating flows of air divided into two inside a casing in an electronic apparatus according to the first embodiment.

FIG. 11 is a side sectional view illustrating flows of air divided into two inside a casing in an electronic apparatus according to the first embodiment. The casing and the electronic apparatus depicted in FIG. 11 may be the casing 20 and the electronic apparatus 10 depicted in FIG. 1. In FIG. 11, arrows represent flows of air. The sizes of the arrows are in proportion to flow rates of air.

As illustrated in FIG. 11, when the plurality of fan units 40 operate, the plurality of fan units 40 suck air within the casing 20, and exhaust the air to the rear of the casing 20. When the plurality of fan units 40 suck the air within the casing 20, air is taken into the casing 20 from the upper and lower intake ports 31 arranged in the detachable units 30.

The air taken in from the intake ports 31 on the upper side is divided into air flowing on the upper side of the board 50 and air flowing into the gap 38 between the detachable units 30 and the board 50. The air taken in from the intake ports 31 on the lower side merges with the air flowing into the gap 38 between the detachable units 30 and the board 50 to form an air flowing on the lower side of the board 50. Thus, inside the casing 20, the board 50 divides the flows of the air in the front-rear direction of the casing 20 into two in the upward-downward direction of the casing 20.

The air flowing on the upper side of the board 50 cools the plurality of heat generating devices 52, the other devices 53, and the like arranged on the upper surface of the board 50, and is exhausted from the exhaust ports 46 provided to the back surfaces of the fan units 40 to the rear of the casing 20. Meanwhile, the air flowing on the lower side of the board 50 is guided by the duct structure 80, cools the heat radiating device 54 and the like arranged on the lower surface of the board 50, and is exhausted from the exhaust ports 46 to the rear of the casing 20.

The plurality of heat generating devices 52, the other devices 53, and the like are arranged at a high density on the upper surface of the board 50. On the other hand, parts generating smaller amounts of heat than the heat generating devices 52 and the other devices 53 are arranged on the lower surface of the board 50. Therefore, in the electronic apparatus 10, the flow rate of the air flowing on the upper side of the board 50 is set higher than the flow rate of the air flowing on the lower side of the board 50.

The angle of the fin 43 may be changed as appropriate according to cooled conditions of the heat generating devices 52, the other devices 53, the heat radiating device 54, and the like. Changing the angle of the fin 43 changes a ratio between the flow rates of the air flowing on the upper side of the board 50 and the air flowing on the lower side of the board 50. The heat generating devices 52, the other devices 53, the heat radiating device 54, and the like are thereby cooled properly.

Actions and effects of the first embodiment will next be described.

As described above in detail, according to the electronic apparatus 10 in accordance with the first embodiment, the heat generating devices 52 and the other devices 53 are arranged on the upper surface of the board 50. The heat radiating device 54 is disposed on the lower surface of the board 50. The board 50 housed in the casing 20 divides flows of air inside the casing 20 into two in the upward-downward direction of the casing 20. Hence, because the airs are separately supplied to the heat generating devices 52 and the other devices 53 and to the heat radiating device 54, it is possible to cool the heat radiating device 54 while cooling the heat generating devices 52 and the other devices 53.

For example, the duct structure 80 is formed between the board 50 including the heat radiating device 54 disposed thereon and the bottom wall portion 27 of the casing 20 by providing the first seal member 60. Hence, air may be forcibly passed through the inside of the heat radiating device 54 by guiding the air to the heat radiating device 54 through the duct structure 80. Consequently, air having a higher speed passes through the inside of the heat radiating device 54. Therefore efficiency of cooling the heat radiating device 54 may be improved.

The heat generating devices 52 disposed on the upper surface of the board 50 are coupled to the heat radiating device 54 disposed on the lower surface of the board 50 by the heat transport members 55. Hence, in addition to the cooling of the heat generating devices 52 by the air passing on the upper side of the board 50, the heat generating devices 52 may also be cooled by transporting the heat of the heat generating devices 52 to the heat radiating device 54 by the heat transport members 55. Thereby efficiency of cooling the heat generating devices 52 may be improved.

Improving the efficiency of cooling of the heat generating devices 52 may reduce a heat influence in the vicinity of the heat generating devices 52. Thus, the other devices 53 disposed in the vicinity of the heat generating devices 52 may also be cooled effectively.

As illustrated in FIG. 8 and FIG. 9, the first seal member 60 forming the duct structure 80 includes the side edge seal portion 61 and the rear end seal portion 62. The side edge seal portion 61 is disposed from the front end portion 50B to the rear end portion 50C of the board 50 along the side edge portion 50A of the board 50, and seals a gap between the side edge portion 50A of the board 50 and the side wall portion 25 of the casing 20. The rear end seal portion 62 seals a gap between the rear end portion 50C of the board 50 and the rear wall portion 26 of the casing 20. Hence, because the first seal member 60 includes the side edge seal portion 61 and the rear end seal portion 62 described above, airtightness of the duct structure 80 illustrated in FIG. 10 and FIG. 11 is secured, and air is passed through the inside of the heat radiating device 54 more forcibly. The efficiency of cooling the heat radiating device 54 may therefore be improved more.

In addition to the first seal member 60, the second seal member 70 illustrated in FIG. 8 and FIG. 9 is applied to the duct structure 80. The second seal member 70 seals gaps penetrating in the thickness direction of the board 50 between the fan units 40 arranged in the rear portion of the casing 20 and the casing 20 and between the fan units 40 and the board 50. Hence, airtightness of peripheral portions of the fan units 40 is secured by the second seal member 70. Therefore air may be passed through inside of the heat radiating device 54 more forcibly.

The casing 20 is provided with the guide walls 23 arranged on both sides in the width direction of the notch portion 51 and the partition walls 24 arranged between the plurality of fan units 40. On the other hand, the above-described first seal member 60 includes the guide wall seal portion 63 and the partition wall seal portion 64. The guide wall seal portion 63 seals a gap penetrating in the thickness direction of the board 50 between the guide wall 23 and the board 50. The partition wall seal portion 64 seals a gap penetrating in the thickness direction of the board 50 between the partition wall 24 and the board 50.

Further, the second seal member 70 includes the first fan unit seal portion 71 and the second fan unit seal portion 72. The first fan unit seal portion 71 seals a gap penetrating in the thickness direction of the board 50 between the fan unit 40 and the guide wall 23. The second fan unit seal portion 72 seals a gap penetrating in the thickness direction of the board 50 between the fan unit 40 and the board 50.

Hence, airtightness of the guide walls 23, the partition walls 24, and the peripheral portions of the fan units 40 is secured by the first seal member 60 and the second seal member 70. Therefore air may be passed through the inside of the heat radiating device 54 even more forcibly.

As illustrated in FIG. 11, the detachable units 30 detachable from the board 50 are arranged in the front portion of the casing 20. The heat transport members 55 couple the heat generating devices 52 to the heat radiating device 54 through the gap 38 between the detachable units 30 and the board 50. Hence, because the gap 38 between the detachable units 30 and the board 50 is used as passing holes for the heat transport members 55, passing holes for passing the heat transport members 55 do not need to be formed in the board 50. Consequently, mounting efficiency of the board 50 may be improved.

An arrangement space for the heat radiating device 54 may be secured easily by arranging the heat radiating device 54 on the lower surface of the board 50. As illustrated in FIG. 4, the heat radiating device 54 extends from one end side to the other end side in the width direction of the board 50. Hence, because the capacity of the heat radiating device 54 is increased, cooling performance of the heat radiating device 54 may be improved.

As illustrated in FIG. 11, the fan units 40 each include the fin 43 opposed to the fan 42. The fin 43 may rotate in the upward-downward direction of the casing 20. Hence, it is possible to change the ratio between the flow rates of the air flowing on the upper side of the board 50 and the air flowing on the lower side of the board 50 by changing the angle of the fin 43 as appropriate according to cooled conditions of the heat generating devices 52, the other devices 53, and the heat radiating device 54, for example. The heat generating devices 52, the other devices 53, and the heat radiating device 54 may therefore be cooled more properly.

Modifications of the first embodiment will next be described.

In the first embodiment, the opening 21 is formed in the front surface of the casing 20. The intake ports 31 formed in the detachable units 30 are arranged inside the opening 21. However, openings functioning as intake ports may be directly formed in the front surface (front wall portion) of the casing 20.

In the first embodiment, the fan units 40 operate to suck air inside the casing 20 and exhaust the air to the rear of the casing 20. However, the fan units 40 may operate to suck air in the rear of the casing 20 and supply the air to the inside of the casing 20. In this case, the intake ports 31 are arranged in the back surface of the casing 20, and the exhaust ports 46 are arranged in the front surface of the casing 20.

In the first embodiment, the heat generating devices 52 include a CPU. However, heat generating parts other than a CPU may be included.

In the first embodiment, the first seal member 60 may seal gap parts other than those described above as long as the gap parts are gaps penetrating in the thickness direction of the board 50 between the board 50 and the casing 20.

In the first embodiment, in addition to the first seal member 60, the second seal member 70 is more preferably applied to the duct structure 80. However, the second seal member 70 may be omitted.

In the first embodiment, the heat transport members 55 preferably pass through the gap 38 between the detachable units 30 and the board 50. However, the heat transport members 55 may pass through holes or notches formed in the board 50.

In the first embodiment, the heat radiating device 54 preferably extends from one end side to the other end side in the width direction of the board 50. However, the heat radiating device 54 may be formed to be smaller in the width direction than the board 50, and extend over a part in the width direction of the board 50.

In the first embodiment, the fan units 40 are provided with a fin 43. However, the fin 43 may be omitted. While the fin 43 is rotatable, the fin 43 may be of a fixed type.

In the first embodiment, the electronic apparatus 10 is disposed horizontally such that the width direction of the electronic apparatus 10 coincides with a horizontal direction. However, the electronic apparatus 10 may be disposed vertically such that the width direction of the electronic apparatus 10 coincides with a vertical direction.

Second Embodiment

Description will next be made of a second embodiment of the technology disclosed in the present application.

Figure 12:
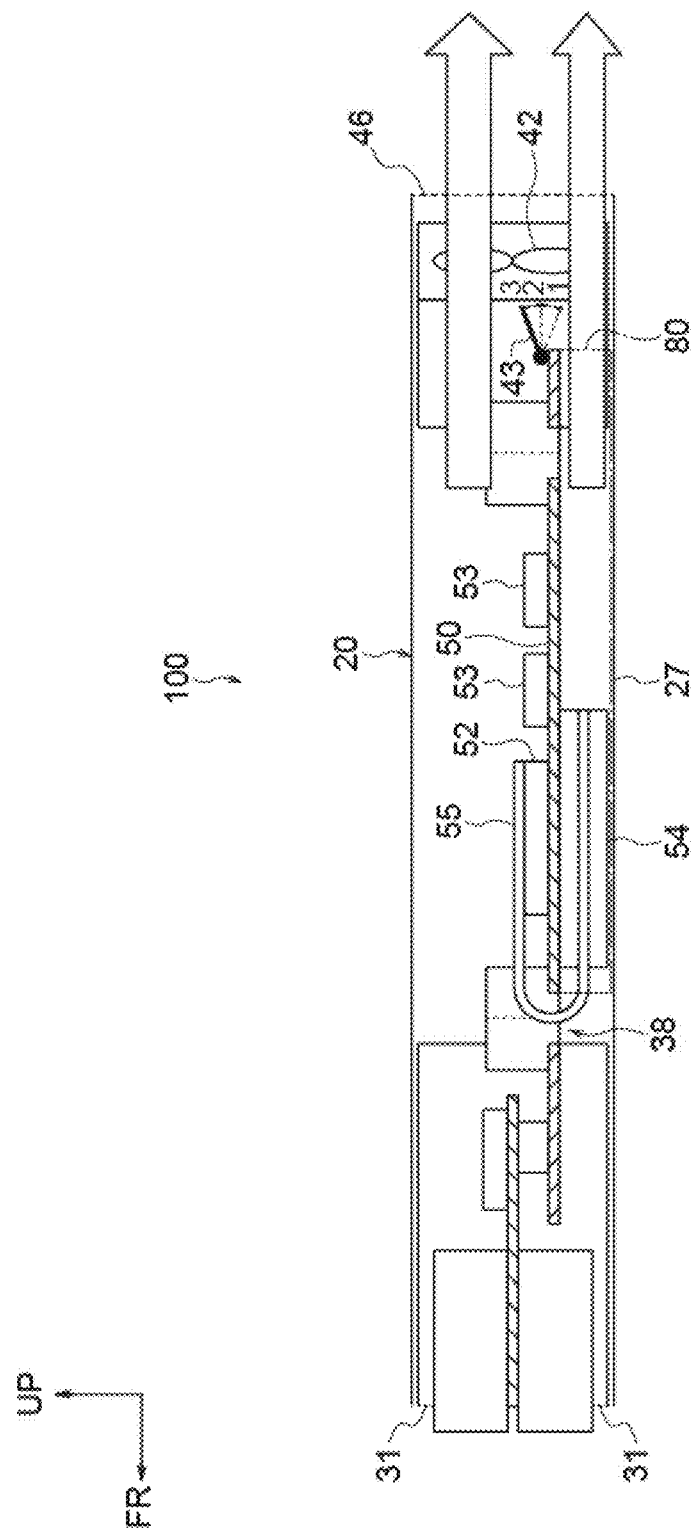
FIG. 12 is a side sectional view of an electronic apparatus according to a second embodiment.
Figure 13:
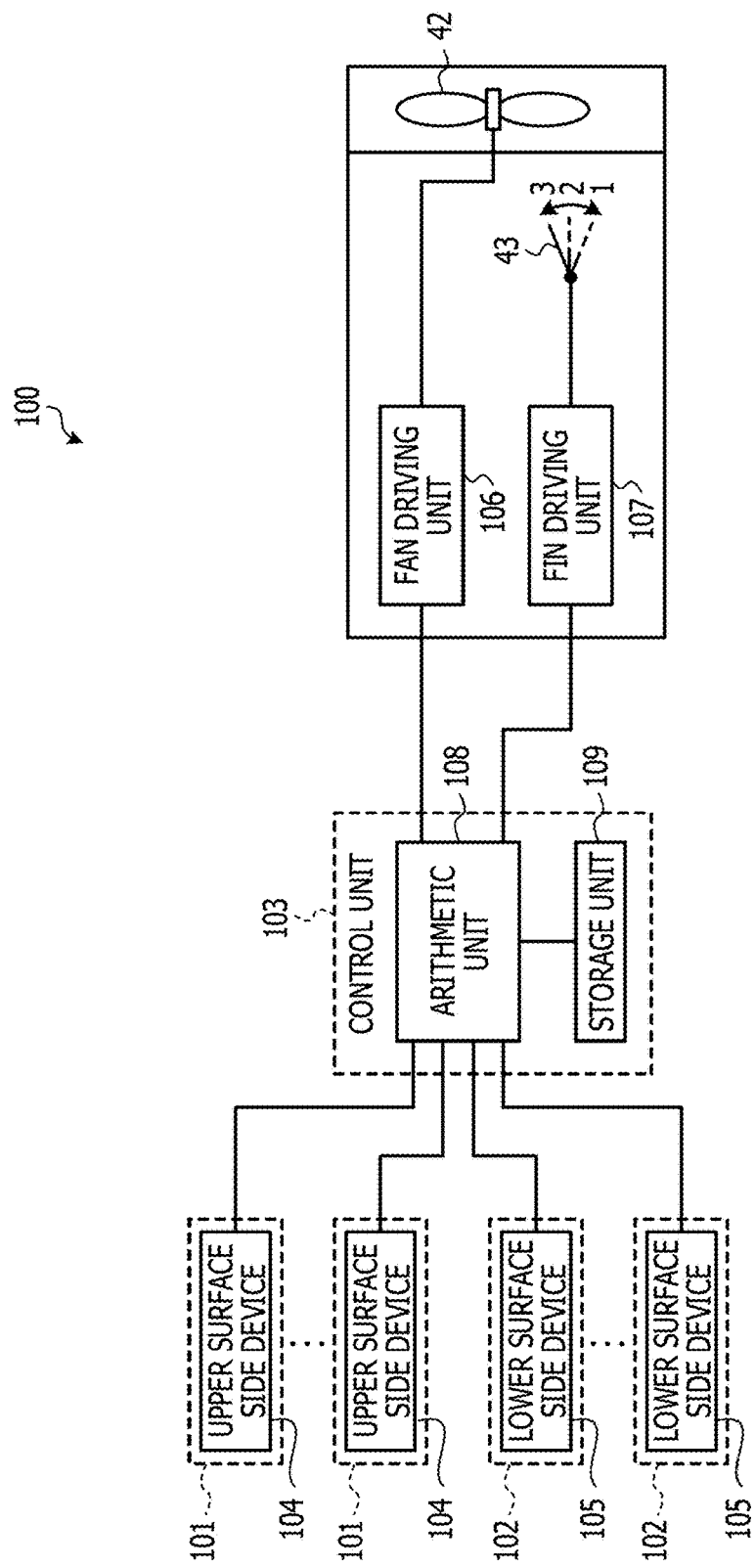
FIG. 13 is a block diagram illustrating an electric coupling configuration of an electronic apparatus according to the second embodiment.

FIG. 12 is a side sectional view of an electronic apparatus according to a second embodiment. FIG. 13 is a block diagram illustrating an electric coupling configuration of an electronic apparatus according to the second embodiment. An electronic apparatus 100 according to the second embodiment is configured by adding the following cooling function to the electronic apparatus 10 according to the foregoing first embodiment.

For example, as illustrated in FIG. 13, the electronic apparatus 100 according to the second embodiment includes a plurality of upper surface side temperature detecting units 101, a plurality of lower surface side temperature detecting units 102, and a control unit 103. The plurality of upper surface side temperature detecting units 101 are sensors detecting the respective temperatures of a plurality of upper surface side devices 104 arranged on the upper surface of the board 50. The lower surface side temperature detecting units 102 are sensors detecting the respective temperatures of a plurality of lower surface side devices 105 arranged on the lower surface of the board 50.

The plurality of upper surface side devices 104 include a heat generating device 52 illustrated in FIG. 12. The plurality of lower surface side devices 105 include a heat radiating device 54 illustrated in FIG. 12. The heat generating device 52 is disposed on the upper surface of the board 50. However, by being thermally coupled to the heat radiating device 54 disposed on the lower surface of the board 50, the heat generating device 52 is cooled while assumed to be one of the lower surface side devices arranged on the lower surface of the board 50.

The control unit 103 controls a fan driving unit 106 and a fin driving unit 107 provided to a fan unit 40 to be described later based on detection results of the plurality of upper surface side temperature detecting units 101 and the plurality of lower surface side temperature detecting units 102. For example, the control unit 103 operates so that the temperatures of the plurality of upper surface side devices 104 and the plurality of lower surface side devices 105 fall within a range between a specified upper limit value and a specified lower limit value determined in advance. In addition, the control unit 103 operates to minimize the rotational speed of the fan 42.

The control unit 103 includes an arithmetic unit 108 and a storage unit 109. The storage unit 109 stores a program for performing S1 to S13 to be described later. The arithmetic unit 108 reads and executes the program in the storage unit 109. The arithmetic unit 108 is, for example, a CPU. The arithmetic unit 108 corresponds to the above-described heat generating device 52 disposed on the upper surface of the board 50.

The fan unit 40 includes the fan driving unit 106 and the fin driving unit 107 in addition to the fan 42 and the fin 43. The fan driving unit 106 is, for example, a motor. The fan driving unit 106 constitutes a blower together with the fan 42. The fin driving unit 107 includes a motor for rotating the fin 43 and a reduction gear mechanism.

The angle of the fin 43 may be set in three steps, for example. Angle 1 represents a state in which the fin 43 is oriented downward. Angle 2 represents a state in which the fin 43 is oriented horizontally. Angle 3 represents a state in which the fin 43 is oriented upward. When the fin 43 is at angle 1, an air flow on the lower side of the board 50 with respect to an air flow on the upper side of the board 50 is relatively minimized. When the fin 43 is at angle 3, on the other hand, the air flow on the lower side of the board 50 with respect to the air flow on the upper side of the board 50 is relatively maximized. At angle 3, the plurality of upper surface side devices 104 and the plurality of lower surface side devices 105 may be fully cooled when a total power of the plurality of upper surface side devices 104 and the plurality of lower surface side devices 105 is at a maximum.

Figure 14:
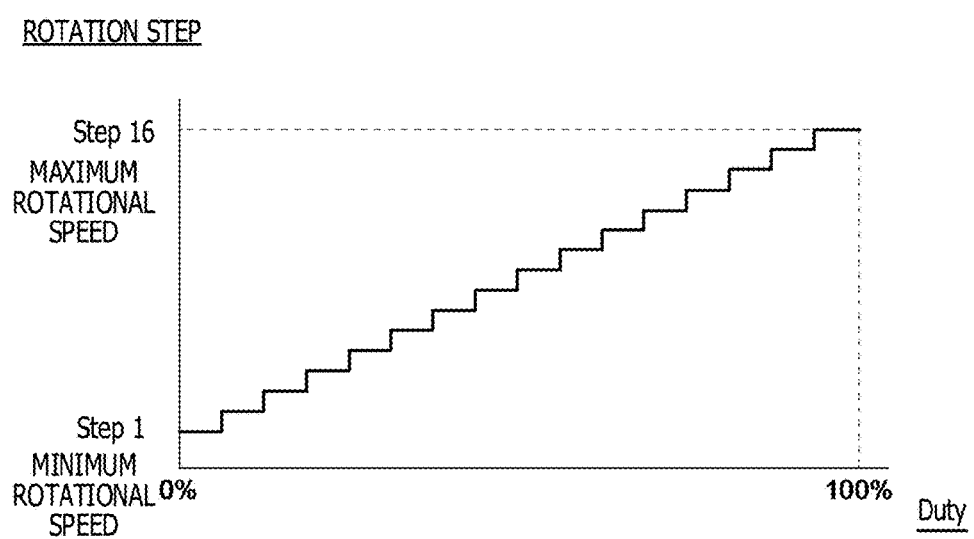
FIG. 14 is a diagram illustrating relation between rotation steps and a duty ratio for controlling a fan driving unit in an electronic apparatus according to the second embodiment.

FIG. 14 is a diagram illustrating relation between rotation steps and a duty ratio for controlling a fan driving unit in an electronic apparatus according to the second embodiment. The fan driving unit and the electronic apparatus may be the fan driving unit 106 depicted in FIG. 13 and the electronic apparatus 100 depicted in FIG. 12. As illustrated in FIG. 14, in the second embodiment, a rotation-drivable range of the fan driving unit 106 (rotatable range of the fan 42) is divided into a plurality of rotation steps. Rotational speed control systems for the fan driving unit 106 include a pulse width modulation (PWM) system that controls the rotational speed by the duty ratio of a PWM signal input to the fan driving unit 106 and a voltage control system that controls the rotational speed by the voltage of a control signal input to the fan driving unit 106. In either of cases where the systems are used, the rotation-drivable range of the fan driving unit 106 is divided into a plurality of rotation steps.

FIG. 14 illustrates, as an example, a graph indicating relation between the duty ratio and the rotational speed in a case where the rotation-drivable range of the PWM control system is divided into 16 rotation steps. Rotation step 1 represents a lowest rotational speed and hence a minimum air flow inside the casing 20. Rotation step 16 represents a highest rotational speed and hence a maximum air flow inside the casing 20. The number of divisions of the rotation-drivable range of the fan driving unit 106 is not limited to 16, but may be set arbitrarily. A linear change may be made in the rotation-drivable range of the fan driving unit 106 without the rotation-drivable range being divided.

Figure 15:
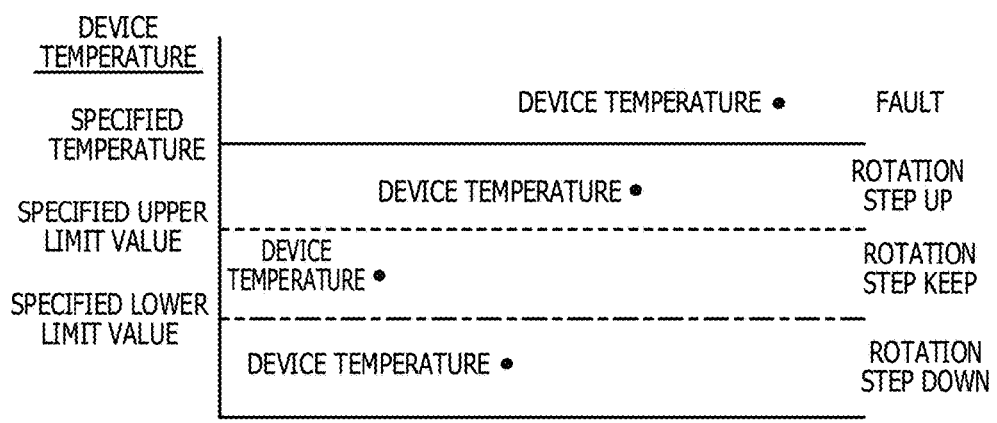
FIG. 15 is a diagram illustrating specified temperatures, specified upper limit values, and specified lower limit values set for respective devices in an electronic apparatus according to the second embodiment.

FIG. 15 is a diagram illustrating specified temperatures, specified upper limit values, and specified lower limit values set for respective devices in an electronic apparatus according to the second embodiment. The electronic apparatus may be the electronic apparatus 100 depicted in FIG. 12. As illustrated in FIG. 15, set for each of the devices as temperature monitoring targets are a maximum specified temperature specified in advance and a specified upper limit value and a specified lower limit value that are obtained by providing a margin to the specified temperature. The specified upper limit value and the specified lower limit value are specified in advance.

FIG. 16 is a diagram illustrating device information stored in a storage unit in an electronic apparatus according to the second embodiment. The storage unit and the electronic apparatus may be the storage unit 109 depicted in FIG. 13 and the electronic apparatus 100 depicted in FIG. 12. As illustrated in FIG. 16, the storage unit 109 stores the set values set in FIG. 15 for the respective devices. As illustrated in FIG. 16, the storage unit 109 also stores whether or not the devices as temperature monitoring targets are disposed on the lower surface of the board 50.

Description will next be made of operation of the above-described cooling function added to the electronic apparatus 100 according to the second embodiment.

In the second embodiment, basics of rotation control of the fan driving unit 106 are as follows. For example, monitored values of the devices as temperature monitoring targets are compared with respective set values, and determinations of the following (1) to (3) are performed.

(1) When device temperatures are each lower than the specified lower limit value, a rotation step is decreased by one.

(2) When at least one of the device temperatures exceeds the specified upper limit value, the rotation step is increased by one.

(3) When at least one of the device temperatures exceeds the specified lower limit value and the device temperatures are each lower than the specified upper limit value, the rotation step is maintained.

Priority is given to falling all of the device temperatures between the specified temperatures, and therefore determination priorities are set such that (2)>(3)>(1).

Figure 17:
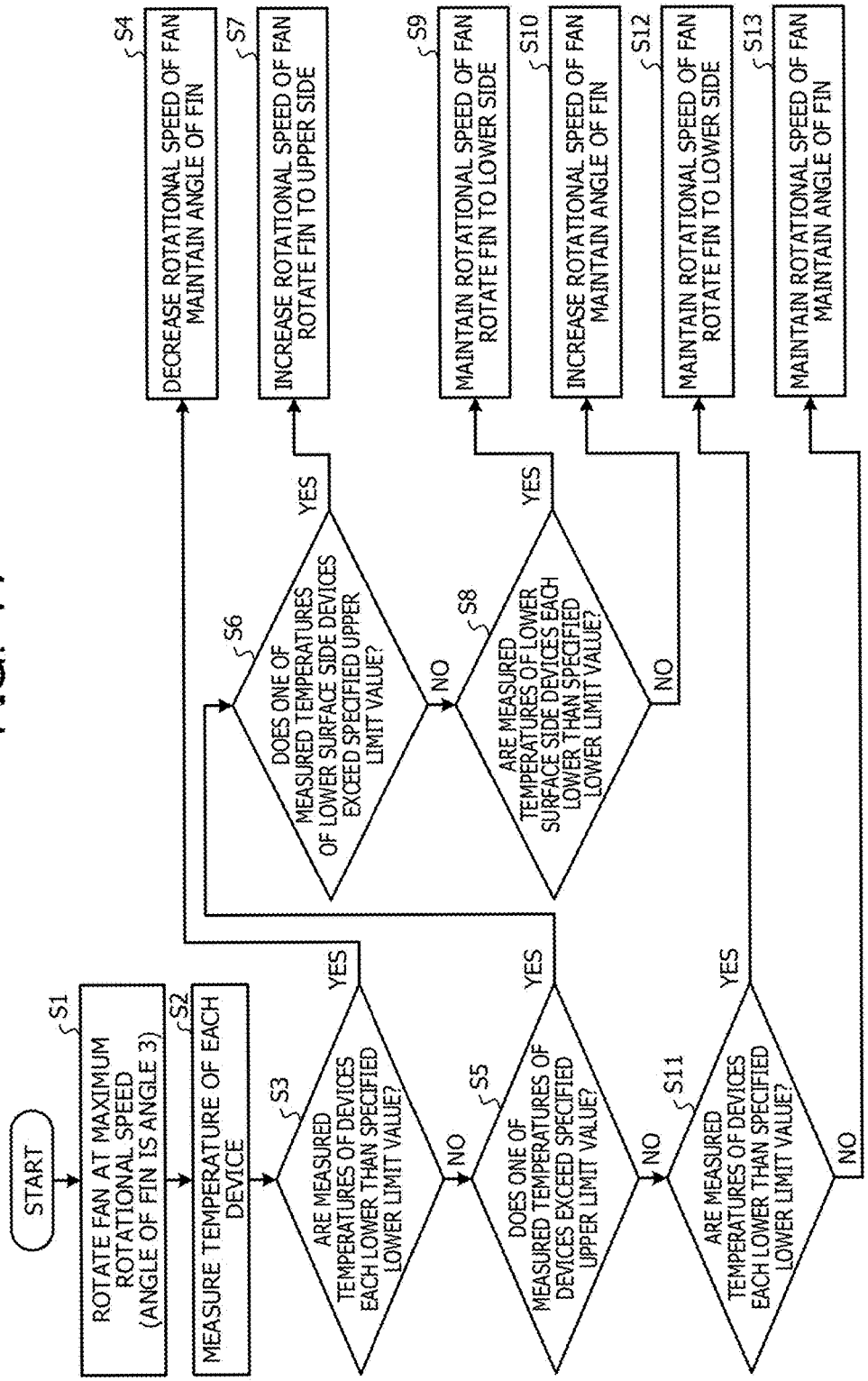
FIG. 17 is a flowchart illustrating a flow of processing of a control unit in an electronic apparatus according to the second embodiment.

FIG. 17 is a flowchart illustrating a flow of processing of a control unit in an electronic apparatus according to the second embodiment. The control unit and the electronic apparatus may be the control unit 103 depicted in FIG. 13 and the electronic apparatus 100 depicted in FIG. 12. The operation of the above-described cooling function added to the electronic apparatus 100 according to the second embodiment will be concretely described in the following with reference to FIG. 17.

In S1, the control unit 103 operates the fan driving unit 106 at a maximum rotation level (rotation step 16), and thus rotates the fan at a maximum rotational speed. The angle of the fin 43 is set at angle 3 as an initial value.

In S2, the control unit 103 measures the temperatures of the plurality of upper surface side devices 104 and the plurality of lower surface side devices 105 based on detection results of the plurality of upper surface side temperature detecting units 101 and the plurality of lower surface side temperature detecting units 102.

In S3, the control unit 103 determines whether the temperatures of the plurality of upper surface side devices 104 and the plurality of lower surface side devices 105 which temperatures are measured in S2 are each lower than the specified lower limit value.

Here, when the temperatures of the plurality of upper surface side devices 104 and the plurality of lower surface side devices 105 which temperatures are measured in S2 are each lower than the specified lower limit value, the plurality of upper surface side devices 104 and the plurality of lower surface side devices 105 are each cooled excessively. In this case, the control unit 103 proceeds from S3 to S4.

Then, in S4, the control unit 103 outputs a control signal to the fan driving unit 106 to decrease the rotation step, and outputs a control signal to the fin driving unit 107 to maintain the set value of the angle of the fin 43. Consequently, the rotational speed of the fan 42 is decreased, and the angle of the fin 43 is maintained.

Thus, when the temperatures of the plurality of upper surface side devices 104 and the temperatures of the plurality of lower surface side devices 105 which temperatures are measured in S2 are each lower than the specified lower limit value, the control unit 103 decreases the rotational speed of the fan 42, and maintains the angle of the fin 43.

On the other hand, there is a case where one of the temperatures of the plurality of upper surface side devices 104 and the plurality of lower surface side devices 105 which temperatures are measured in S2 exceeds the specified lower limit value. In this case, the control unit 103 proceeds from S3 to S5.

Then, in S5, the control unit 103 determines whether one of the temperatures of the plurality of upper surface side devices 104 and the plurality of lower surface side devices 105 which temperatures are measured in S2 exceeds the specified upper limit value.

Here, when one of the temperatures of the plurality of upper surface side devices 104 and the plurality of lower surface side devices 105 which temperatures are measured in S2 exceeds the specified upper limit value, one of the plurality of upper surface side devices 104 and the plurality of lower surface side devices 105 is not cooled sufficiently. In this case, the control unit 103 proceeds from S5 to S6.

Then, in S6, the control unit 103 determines whether one of the temperatures of the plurality of lower surface side devices 105 which temperatures are measured in S2 exceeds the specified upper limit value.

Here, when one of the temperatures of the plurality of lower surface side devices 105 which temperatures are measured in S2 exceeds the specified upper limit value, one of the plurality of lower surface side devices 105 is not cooled sufficiently. A supposed reason therefor is that the angle of the fin 43 is decreased. In this case, the control unit 103 proceeds from S6 to S7.

In a stage of proceeding from S6 to S7, there is a possibility that one of the temperatures of the plurality of upper surface side devices 104 exceeds the specified upper limit value. When one of the temperatures of the plurality of upper surface side devices 104 exceeds the specified upper limit value, one of the plurality of upper surface side devices 104 is not cooled sufficiently.

Then, in S7, the control unit 103 outputs a control signal to the fan driving unit 106 to increase the rotation step. The control unit 103 then outputs a control signal to the fin driving unit 107 to increase the set value of the angle of the fin 43. Consequently, the rotational speed of the fan 42 is increased, and the fin 43 is rotated to the upper side.

Thus, when one of the temperatures of the plurality of lower surface side devices 105 which temperatures are measured in S2 exceeds the specified upper limit value, the control unit 103 increases the rotational speed of the fan 42, and rotates the fin 43 to the upper side.

On the other hand, there is a case where the temperatures of the plurality of lower surface side devices 105 which temperatures are measured in S2 are each lower than the specified upper limit value. In this case, the control unit 103 proceeds from S6 to S8.

Then, in S8, the control unit 103 determines whether the temperatures of the plurality of lower surface side devices 105 which temperatures are measured in S2 are each lower than the specified lower limit value.

Here, when the temperatures of the plurality of lower surface side devices 105 which temperatures are measured in S2 are each lower than the specified lower limit value, the plurality of lower surface side devices 105 are cooled excessively. In this case, the control unit 103 proceeds from S8 to S9.

In a stage of proceeding from S8 to S9, the plurality of upper surface side devices 104 are cooled insufficiently, and one of the temperatures of the plurality of upper surface side devices 104 exceeds the specified upper limit value.

Then, in S9, the control unit 103 outputs a control signal to the fan driving unit 106 to maintain the rotation step. The control unit 103 then outputs a control signal to the fin driving unit 107 to decrease the set value of the angle of the fin 43. Consequently, the rotational speed of the fan 42 is maintained, and the fin 43 is rotated to the lower side.

Thus, there is a case where the temperatures of the plurality of lower surface side devices 105 which temperatures are measured in S2 are each lower than the specified lower limit value, and one of the temperatures of the plurality of upper surface side devices 104 exceeds the specified upper limit value. In this case, the control unit 103 maintains the rotational speed of the fan 42, and rotates the fin 43 to the lower side.

On the other hand, there is a case where the temperatures of the plurality of lower surface side devices 105 which temperatures are measured in S2 are each lower than the specified upper limit value, but one of the temperatures of the plurality of lower surface side devices 105 exceeds the specified lower limit value. In this case, one of the temperatures of the plurality of upper surface side devices 104 may exceed the specified upper limit value. In this case, the control unit 103 proceeds from S8 to S10.

Then, in S10, the control unit 103 outputs a control signal to the fan driving unit 106 to increase the rotation step, and outputs a control signal to the fin driving unit 107 to maintain the set value of the angle of the fin 43. Consequently, the rotational speed of the fan 42 is increased, and the angle of the fin 43 is maintained.

Thus, there is a case where the temperatures of the plurality of lower surface side devices 105 which temperatures are measured in S2 are each lower than the specified upper limit value, but one of the temperatures of the plurality of lower surface side devices 105 exceeds the specified lower limit value. In this case, one of the temperatures of the plurality of upper surface side devices 104 may exceed the specified upper limit value. In this case, the control unit 103 increases the rotational speed of the fan 42, and maintains the angle of the fin 43.

On the other hand, there is a case where one of the temperatures of the plurality of upper surface side devices 104 and the plurality of lower surface side devices 105 which temperatures are measured in S2 exceeds the specified lower limit value, but the temperatures of the plurality of upper surface side devices 104 and the plurality of lower surface side devices 105 are each lower than the specified upper limit value. In this case, the control unit 103 proceeds from S5 to S11.

Then, in S11, the control unit 103 determines whether the temperatures of the plurality of lower surface side devices 105 which temperatures are measured in S2 are each lower than the specified lower limit value.

Here, when the temperatures of the plurality of lower surface side devices 105 which temperatures are measured in S2 are each lower than the specified lower limit value, the plurality of lower surface side devices 105 are cooled excessively. In this case, the control unit 103 proceeds from S11 to S12.

Then, in S12, the control unit 103 outputs a control signal to the fan driving unit 106 to maintain the rotation step. The control unit 103 then outputs a control signal to the fin driving unit 107 to decrease the set value of the angle of the fin 43. Consequently, the rotational speed of the fan 42 is maintained, and the fin 43 is rotated to the lower side.

Thus, there is a case where the temperatures of the plurality of upper surface side devices 104 and the plurality of lower surface side devices 105 which temperatures are measured in S2 are each lower than the specified upper limit value, and the temperatures of the plurality of lower surface side devices 105 are each lower than the specified lower limit value. In this case, the control unit 103 maintains the rotational speed of the fan 42, and rotates the fin 43 to the lower side.

On the other hand, there is a case where the temperatures of the plurality of upper surface side devices 104 and the plurality of lower surface side devices 105 are each lower than the specified upper limit value, but one of the temperatures of the plurality of lower surface side devices 105 exceeds the specified lower limit value. In this case, the rotational speed of the fan 42 and the angle of the fin 43 are each appropriate. The control unit 103 therefore proceeds from S11 to S13.

Then, in S13, the control unit 103 outputs a control signal to the fan driving unit 106 to maintain the rotation step. The control unit 103 then outputs a control signal to the fin driving unit 107 to maintain the angle of the fin 43. Consequently, the rotational speed of the fan 42 is maintained, and the angle of the fin 43 is maintained.

Thus, there is a case where the temperatures of the plurality of upper surface side devices 104 and the temperatures of the plurality of lower surface side devices 105 which temperatures are measured in S2 are each lower than the specified upper limit value, but one of the temperatures of the plurality of lower surface side devices 105 exceeds the specified lower limit value. In this case, the control unit 103 maintains the rotational speed of the fan 42, and maintains the angle of the fin 43.

Description will next be made of actions and effects of the second embodiment which actions and effects are different from those of the foregoing first embodiment.

As described above in detail, according to the electronic apparatus 100 in accordance with the second embodiment, the temperatures of the plurality of upper surface side devices 104 and the plurality of lower surface side devices 105 stabilize in a state of falling within ranges between the specified upper limit values and the specified lower limit values. Hence, the plurality of upper surface side devices 104 and the plurality of lower surface side devices 105 may each be adjusted to appropriate temperatures. The rotational speed of the fan 42 is reduced to a minimum. It is therefore possible to reduce power consumption involved in rotating the fan 42 while maintaining the plurality of upper surface side devices 104 and the plurality of lower surface side devices 105 at appropriate temperatures.

All examples and conditional language recited herein are intended for pedagogical purposes to and the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic apparatus comprising:
    a casing provided with a ventilating opening disposed in a front surface of the casing;
    a plurality of fan devices that are disposed in a rear portion of the casing, and are configured to form a flow of air in a front-rear direction of the casing inside the casing, each of the fan devices includes: a fan; and a fin that is opposed to the fan and is rotatable in the upward-downward direction of the casing;
    a board that includes a heat generating device disposed on an upper surface of the board and includes a heat radiating device disposed on a lower surface of the board, and is housed in the casing, and is configured to divide the flow of the air into two in an upward-downward direction of the casing;
    a heat transport member configured to couple the heat generating device to the heat radiating device; and
    a seal member configured to form a duct structure extending in the front-rear direction of the casing between the board and a bottom wall portion of the casing by sealing a gap penetrating in a thickness direction of the board between the board and the casing;
    upper surface side temperature sensors configured to detect temperatures of a plurality of upper surface side devices arranged on the upper surface of the board, the plurality of upper surface side devices including the heat generating device;
    lower surface side temperature sensors configured to detect temperatures of a plurality of lower surface side devices arranged on the lower surface of the board, the plurality of lower surface side devices including the heat radiating device;
    a fan motor configured to rotate the fan;
    a fin motor configured to change an angle of the fin; and
    a processor configured to control the fan motor and the fin motor on a basis of detection results of the upper surface side temperature sensors and the lower surface side temperature sensors such that the temperatures of the plurality of upper surface side devices and the plurality of lower surface side devices each fall within a range between a specified upper limit value and a specified lower limit value and such that rotational speed of the fan is minimized.

2. The electronic apparatus according to claim 1, wherein the seal member further comprises:
    a side edge side seal portion that is disposed to extend from a front end portion to a rear end portion of the board along a side edge portion of the board, and is configured to seal a gap between the side edge portion of the board and a side wall portion of the casing; and
    a rear end side seal portion configured to seal a gap between the rear end portion of the board and a rear wall portion of the casing.

3. The electronic apparatus according to claim 1, wherein the gap penetrating in the thickness direction of the board between the board and the casing is sealed by a first seal member as the seal member, and
    gaps penetrating in the thickness direction of the board between the fan devices and the casing and between the fan devices and the board are sealed by a second seal member.

4. The electronic apparatus according to claim 3, wherein the plurality of fan devices are:
    arranged side by side in a width direction of the casing; and
    insertable and removable, in the front-rear direction of the casing, into and from a notch portion formed in the board, the casing includes:
  guide walls arranged on both sides in a width direction of the notch portion, and extending in the front-rear direction of the casing; and
  partition walls arranged between the plurality of fan devices, and
the first seal member includes:
  guide wall seal members configured to seal gaps penetrating in the thickness direction of the board between the guide walls and the board; and
  partition wall seal members configured to seal gaps penetrating in the thickness direction of the board between the partition walls and the board, and
the second seal member includes:
  first fan device seal members configured to seal gaps penetrating in the thickness direction of the board between the fan devices and the guide walls and between the fan devices and the partition walls; and
  second fan device seal members configured to seal gaps penetrating in the thickness direction of the board between the fan devices and the board.

5. The electronic apparatus according to claim 1, further comprising:
  a detachable device that is disposed in a front portion of the casing, and is detachable from the board,
  wherein the heat transport member couples the heat generating device to the heat radiating device through a gap between the detachable device and the board.

6. The electronic apparatus according to claim 1,
  wherein the heat radiating device extends from one end side to another end side in a width direction of the board.

7. The electronic apparatus according to claim 1, wherein the processor is configured to:
  decrease the rotational speed of the fan and maintain the angle of the fin when the temperatures of the plurality of upper surface side devices, the temperatures of the plurality of upper surface side devices being detected by the upper surface side temperature sensors, and the temperatures of the plurality of lower surface side devices, the temperatures of the plurality of lower surface side devices being detected by the lower surface side temperature sensors, are each lower than the specified lower limit value;
  increase the rotational speed of the fan and rotate the fin to an upper side when one of the temperatures of the plurality of lower surface side devices, the temperatures of the plurality of lower surface side devices being detected by the lower surface side temperature sensors, exceeds the specified upper limit value;
  maintain the rotational speed of the fan and rotate the fin to a lower side when the temperatures of the plurality of lower surface side devices, the temperatures of the plurality of lower surface side devices being detected by the lower surface side temperature sensors, are each lower than the specified lower limit value, and one of the temperatures of the plurality of upper surface side devices, the temperatures of the plurality of upper surface side devices being detected by the upper surface side temperature sensors, exceeds the specified upper limit value;
  increase the rotational speed of the fan and maintain the angle of the fin when the temperatures of the plurality of lower surface side devices, the temperatures of the plurality of lower surface side devices being detected by the lower surface side temperature sensors, are each lower than the specified upper limit value, one of the temperatures of the plurality of lower surface side devices, the temperatures of the plurality of lower surface side devices being detected by the lower surface side temperature sensors, exceeds the specified lower limit value, and one of the temperatures of the plurality of upper surface side devices, the temperatures of the plurality of upper surface side devices being detected by the upper surface side temperature sensors, exceeds the specified upper limit value;
  maintain the rotational speed of the fan and rotate the fin to the lower side when the temperatures of the plurality of upper surface side devices, the temperatures of the plurality of upper surface side devices being detected by the upper surface side temperature sensors, and the temperatures of the plurality of lower surface side devices, the temperatures of the plurality of lower surface side devices being detected by the lower surface side temperature sensors, are each lower than the specified upper limit value, and the temperatures of the plurality of lower surface side devices, the temperatures of the plurality of lower surface side devices being detected by the lower surface side temperature sensors, are each lower than the specified lower limit value; and
  maintain the rotational speed of the fan and maintain the angle of the fin when the temperatures of the plurality of upper surface side devices, the temperatures of the plurality of upper surface side devices being detected by the upper surface side temperature sensors, and the temperatures of the plurality of lower surface side devices, the temperatures of the plurality of lower surface side devices being detected by the lower surface side temperature sensors, are each lower than the specified upper limit value, and one of the temperatures of the plurality of lower surface side devices, the temperatures of the plurality of lower surface side devices being detected by the lower surface side temperature sensors, exceeds the specified lower limit value.

* * * * *